United States Patent [19]

Iinuma

[11] 4,133,006
[45] Jan. 2, 1979

[54] PREDICTIVE ENCODER OR DECODER WITH SELECTION OF ONE OF TWO OR MORE PREDICTION SIGNALS ACCORDING TO PREDICTION ERROR SIGNAL AMPLITUDES

[75] Inventor: Kazumoto Iinuma, Tokyo, Japan

[73] Assignee: Nippon Electric Co., Ltd., Tokyo, Japan

[21] Appl. No.: 844,857

[22] Filed: Oct. 25, 1977

[30] Foreign Application Priority Data

Oct. 22, 1976 [JP] Japan .................. 51-126866

[51] Int. Cl.$^2$ ............................................. H04N 7/12
[52] U.S. Cl. .................................. 358/133; 358/136; 358/13; 340/347 DD; 325/38 B
[58] Field of Search ............... 358/133, 136, 105, 13; 340/347 DD; 325/38 B

[56] References Cited

U.S. PATENT DOCUMENTS

| | | | |
|---|---|---|---|
| 3,679,821 | 7/1972 | Schroeder | 358/133 |
| 3,890,462 | 6/1975 | Limb et al. | 358/105 |
| 4,075,655 | 2/1978 | Iijima et al. | 325/38 B |

Primary Examiner—Robert L. Richardson
Assistant Examiner—Edward L. Coles
Attorney, Agent, or Firm—Sughrue, Rothwell, Mion, Zinn and Macpeak

[57] ABSTRACT

A system carries out predictive encoding or decoding by selecting a prediction signal for a longer period among two or more prediction signals at the beginning of an autocorrelated signal to be encoded or of a prediction error signal to be decoded. At least one of the prediction signals may be a composite prediction signal. A sampling interval after each instant at which the prediction error signal exceeds in absolute value a threshold level, the encoding or decoding is carried out with the prediction signals switched from one to another. A control circuit for two prediction signals comprises a two-input Exclusive OR gate supplied with a result of comparison of the prediction error signal with the threshold level and a sample delay supplied with the Exclusive OR output. The delayed signal is supplied back to the Exclusive OR gate and forward to a switch for switching the prediction signals.

6 Claims, 4 Drawing Figures

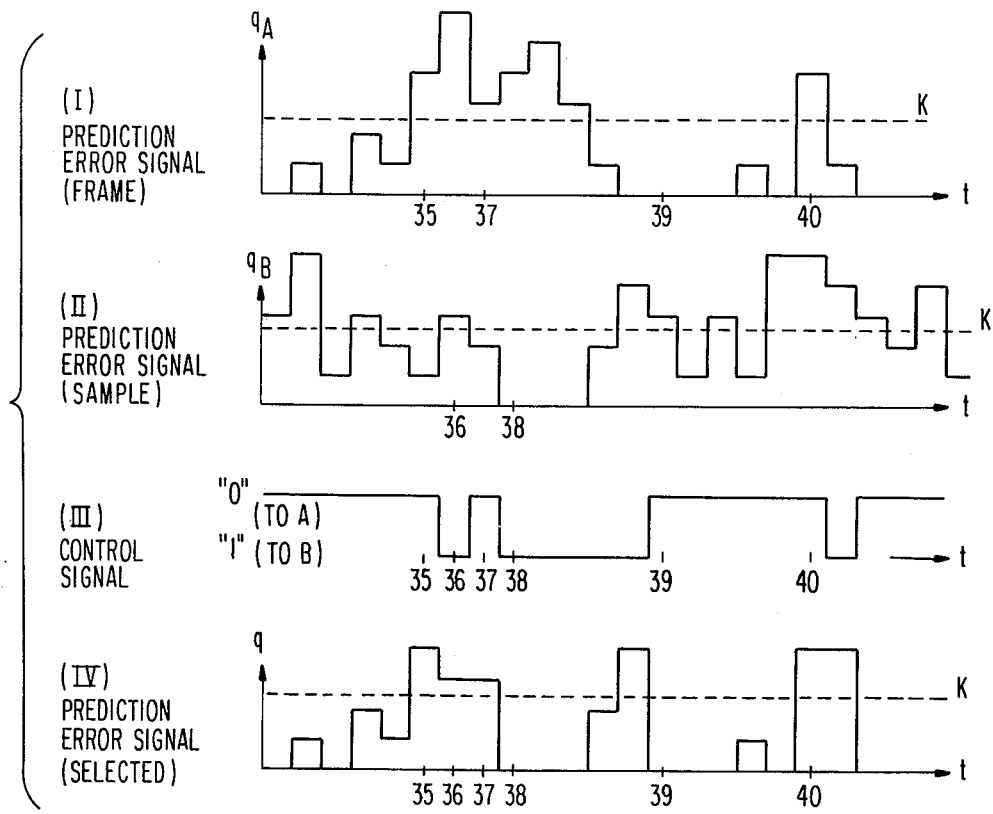
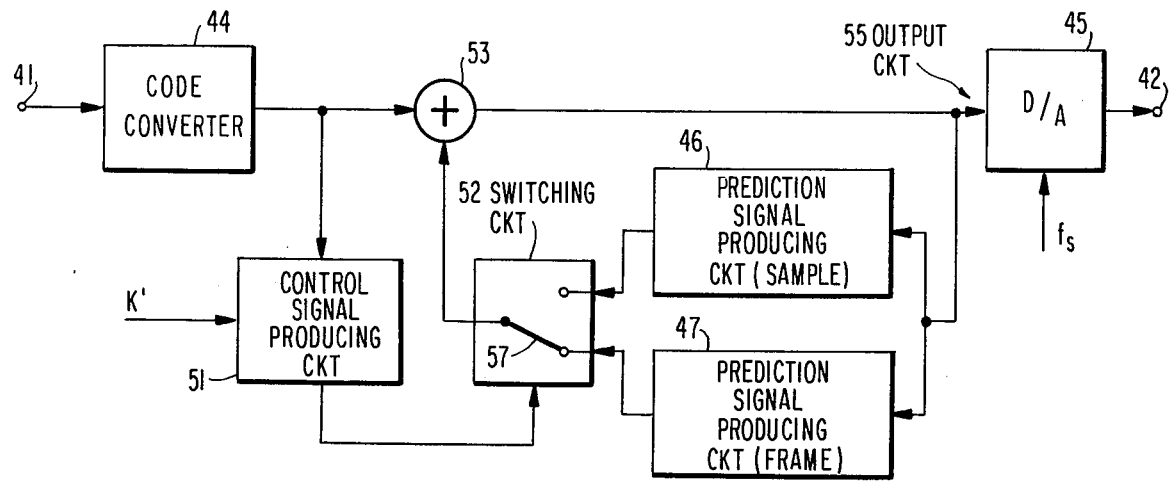

PREDICTIVE ENCODER OR DECODER WITH SELECTION OF ONE OF TWO OR MORE PREDICTION SIGNALS ACCORDING TO PREDICTION ERROR SIGNAL AMPLITUDES

BACKGROUND OF THE INVENTION

This invention relates to a system for carrying out predictive encoding of an autocorrelated signal into a prediction error signal or predictive decoding of a prediction error signal derived from an autocorrelated signal into a reproduction of the last-mentioned autocorrelated signal. An example of the autocorrelated signals to which this invention is applicable is a television signal.

In a television signal, picture signals have a strong degree of correlation along both horizontal and vertical directions of each picture and along the time axis. It is therefore possible by resorting to predictive encoding and decoding to save the amount of information actually transmitted. According to predictive encoding applied to the picture signals, each picture element is represented by that instantaneous amplitude of a prediction error signal which is given by a difference between an unprocessed signal for the picture element and a prediction signal derived for the picture element from a signal for another picture element adjacent to the element under consideration. In intraframe predictive encoding, the prediction signal is derived from a signal for a picture element within the same frame. In interfield and interframe predictive encoding, a picture element corresponding in a next previous field and frame to the picture element in question is used, respectively, to derive the prediction signal. Use is also possible of a composite prediction signal obtained by a combination of the above-named modes of predictive encoding. The intraframe predictive encoding develops prediction signals excellently predictive of the picture elements of a picture of a less sharp contrast to provide a high efficiency. The interframe predictive encoding shows an excellent efficiency when applied to pictures for an object that little moves. The interfield and composite predictive encoding has a feature intermediate between the intraframe and interframe predictive encoding.

In a conventional predictive encoder for a television signal, use is generally made of only one of the various manners of predictive encoding. This is objectionable for a television broadcast signal in which the scene being televised may little or severely vary with respect to time and may be either simple or complicated. In "Conference Record," Volume II, pages 27-12 et seq., of International Conference on Communications held June 16-18, 1975, in San Francisco, Calif., the United States, a predictive encoder is proposed with reference to FIG. 4 (page 27-13). The proposed encoder is operable both in interframe and intraframe encoding modes. A mode controller checks which of the modes provides a higher efficiency for the time being and selects the more efficient mode. With this encoder, it is necessary besides the prediction error signal to transmit the information representative of the mode in which the transmission is in progress.

A television signal is an autocorrelated signal of a type that takes those values at equally spaced successive instants, such as instants of transmission of picture elements, which are substantially correlated to the values the autocorrelated signal takes each of at least two predetermined durations or periods after the respective instants. For a television signal, the two predetermined durations may be any two of an interval between two adjacent ones of the picture elements, a horizontal line period, a field period, a frame period, and a predetermined number of the field and/or frame periods. It is therefore possible to specify for an autocorrelated signal of the type described that a first of the predetermined durations is equal at least to the equal spacing between two adjacent ones of the instants and that a second of the predetermined durations is longer than the first predetermined duration. The prediction error signal as named herein has an amplitude variable from one of the instants to another in compliance with the autocorrelated signal.

SUMMARY OF THE INVENTION

It is therefore an object of the present invention to provide a system for carrying out, with an excellent efficiency, predictive encoding of an autocorrelated signal of the type specified hereinabove into a prediction error signal or predictive decoding of a prediction error signal derived from an autocorrelated signal of the type specified into a reproduction of the last-mentioned autocorrelated signal.

It is another object of this invention to provide a system of the type described, which is capable of carrying out predictive encoding by selecting one of a plurality of modes of predictive encoding that provides a highest possible efficiency at every instant.

It is still another object of this invention to provide a system of the type described, which is capable of carrying out predictive decoding without using a signal representative of the mode in which predictive encoding is in progress in the counterpart predictive encoding system.

According to this invention, there is provided a system for carrying out prescribed one of predictive encoding of an autocorrelated signal of the type specified hereinabove into a prediction error signal of the type also specified hereinabove and predictive decoding of the prediction error signal into a reproduction of the autocorrelated signal, which comprises a plurality of prediction signal producing means responsive to a first signal for producing at least two prediction signals. A first and a second of the prediction signals are predictive, at the respective ones of the instants mentioned hereinabove, of the values the autocorrelated signal takes the first and second predetermined durations described also hereinabove, respectively, after the respective instants. The system further comprises control signal producing means responsive to the prediction error signal for producing a control signal depending on the amplitude the prediction error signal has at each of the instants, switching means responsive to the control signal for selecting one of the at least two prediction signals to produce a second signal at an instant next succeeding the above-mentioned each instant, adder means for producing a sum signal of the second signal and the prediction error signal, means for supplying the sum signal to all of the prediction signal producing means as the first signal, and input means responsive to the autocorrelated signal and the second signal for producing the prediction error signal when the system is for carrying out the predictive encoding and output means responsive to the sum signal for producing the reproduction when the system is for carrying out the predictive decoding.

A prediction error signal produced by a system for carrying out predictive encoding according to this invention may not necessarily reach a system for carrying out predictive decoding according to this invention with exactly same amplitude and waveform.

BRIEF DESCRIPTION OF THE DRAWING

FIG. 3 shows signals for describing operation of the predictive encoder illustrated in FIG. 1; and FIG. 4 is a block diagram of a system according to a second embodiment of this invention for carrying out predictive decoding of a prediction error signal produced by a predictive encoder according to this invention.

DESCRIPTION OF THE PREFERRED EMBODIMENTS

Figure 1:
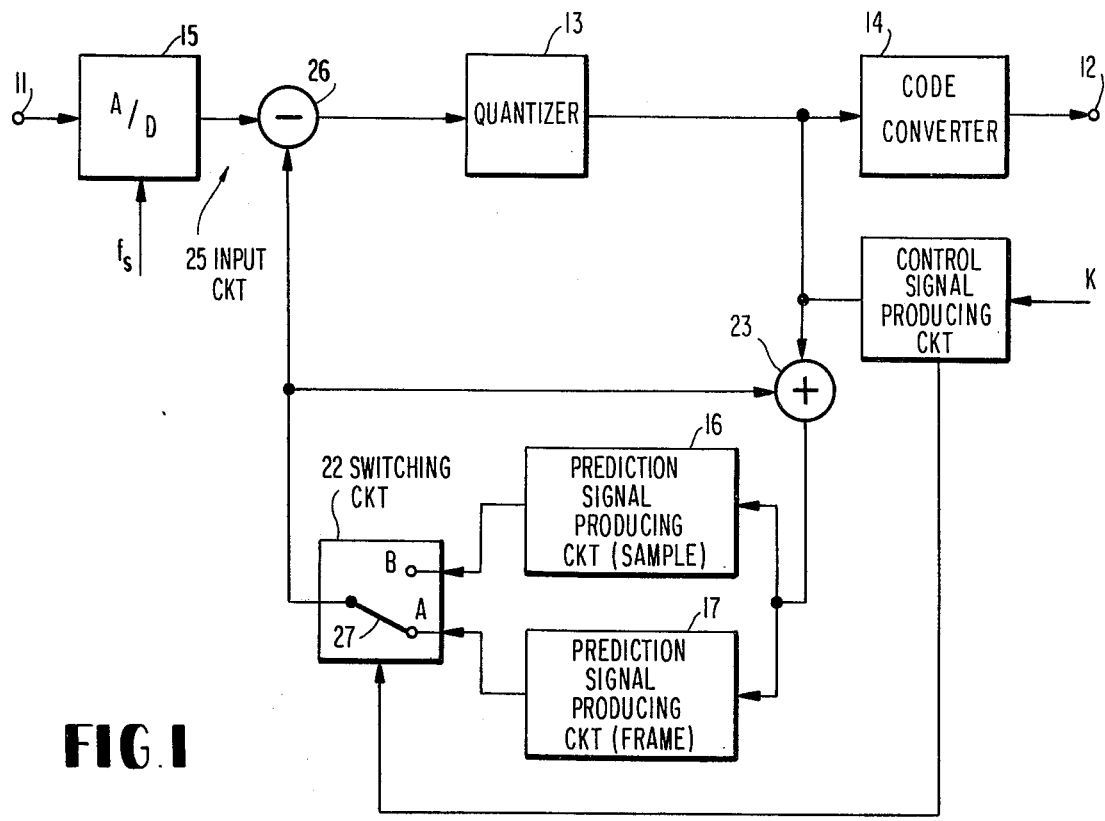
FIG. 1 is a block diagram of a system according to a first embodiment of the present invention for carrying out predictive encoding of a television signal.

Referring to FIG. 1, a system according to a first embodiment of the present invention is for carrying out predictive encoding of an analog television signal into a prediction error signal. The television signal is supplied to an encoder input terminal 11. In the example being illustrated, the prediction error signal is delivered to an encoder output terminal 12 after quantized by a quantizer 13 into a quantized prediction error signal. The quantization is merely for raising the efficiency of compression of the amount of information actually transmitted from the output terminal 12. The quantized prediction error signal will therefore be again called a prediction error signal, which is now converted to a variable length code signal by a code converter 14. In an article contributed to a record, pages 309–314, of Third International Conference on Digital Satellite Communications held the 11–13th November 1975 at Kyoto, Japan, a circuit labelled "ADDRESS CODING" in FIG. 3, page 312, is for carrying out the code conversion described on page 310 with reference to FIG. 6, page 314. Inasmuch as a code converter of the type described is thus already known and has no direct connection with the gist of the instant invention, description thereof will not be made any further.

Further referring to FIG. 1, the analog television signal is converted to a digital television signal by an analog-to-digital converter 15 supplied with a sampling pulse sequence of a sampling frequency $F_s$, which may be a sub-Nyquist sampling frequency. The digital television signal thus takes those values at equally spaced successive instants specified by the sampling pulse sequence, which are substantially correlated to the values the analog or digital television signal takes each of at least two predetermined durations after the respective instants. Examples of the predetermined durations are discussed in the preamble of the instant specification. Merely for simplicity of description, it is surmised here that a first of the predetermined durations is equal to a sampling period, namely, to the equal spacing between two adjacent ones of the successive instants, and that a second is equal to a frame period. Responsive to a first signal, described later, a plurality of prediction signal producing circuits, such as 16 and 17, produce at least two prediction signals. Under the circumstances surmised, a first of the prediction signal producing circuits 16 is a sample delay for producing a first prediction signal predictive, at the respective ones of the successive instants, of the values that the analog or digital television signal takes a sampling period after the respective instants. A second of the prediction signal producing circuits 17 is a frame delay for producing a second prediction signal predictive, at the respective ones of the instants, of the values that the analog or digital television signal takes a frame period after the respective instants. Herein, the second prediction signal is called a longer-period prediction signal. The first prediction signal may be a known intraframe or composite prediction signal. At any rate, the prediction error signal has an amplitude variable from one of the successive instants to another in compliance with the analog or digital television signal in the manner known in the art and described also in the preamble of this specification.

The predictive encoder comprises a control signal producing circuit 21 responsive to the prediction error signal for producing a control signal depending on the amplitude which the prediction error signal has at each of the successive instants. Responsive to the control signal, a switching circuit 22 selects one of the first and second prediction signals at an instant next succeeding the above-mentioned each instant to produce a second signal as named herein. An adder circuit 23 calculates a sum of the second signal and the prediction error signal to produce a sum signal representative of the calculated sum. In the manner known in the art, the sum signal is a locally decoded signal of a value representative of the value that the analog or digital television signal takes at the above-described each instant and is supplied to the prediction signal producing circuits 16 and 17 as the first signal mentioned hereinabove. The predictive encoder further comprises an input circuit 25 responsive to the analog television signal and the second signal for producing the prediction error signal. In the illustrated example, the input circuit 25 comprises the analog-to-digital converter 15 and a subtractor circuit 26 for subtracting the second signal from the digital television signal to produce the still unquantized prediction error signal. It is seen that the switching circuit 22 has a plurality of switch input terminals, such as A and B for receiving the second and first prediction signals, respectively. As symbolized by a mechanical switch arm 27 brought into contact with the switch input terminal A for the second prediction signal, the switching circuit 22 is biassed, while inoperative, to select the longer-period prediction signal when set into operation. This is because a television signal has a synchronizing signal at the beginning thereof, which repeatedly appears at each field or frame period and consequently is well predicted by an interfield or an interframe prediction signal.

Figure 2:
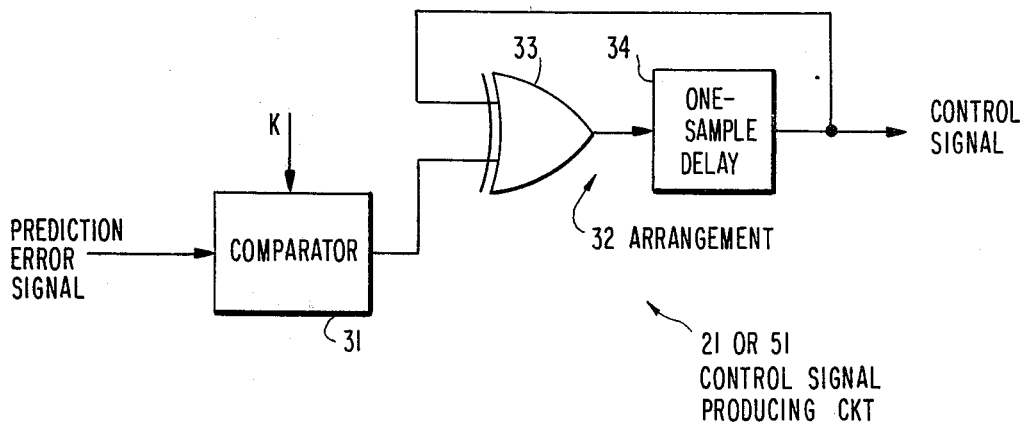
FIG. 2 is a block diagram of a control signal producing circuit for use in the predictive encoder depicted in FIG. 1.

Turning to FIG. 2, an example of the control signal producing circuit 21 comprises a conventional comparator 31 for comparing the prediction error signal with a preselected threshold level K to produce a result signal that is given a first and a second level when the amplitude the prediction error signal has at each of the successive instants is greater and not greater in the absolute value than the threshold level K, respectively. With the absolute value of the amplitude represented by q, the result signal is given the first and second levels when $q > K$ and $q \leq K$, respectively. The control signal producing circuit 21 further comprises an arrangement 32 responsive to the result signal for producing as the control signal mentioned above a first and a second control signal at an instant next succeeding the above-described each instant according as the result signal is given the first and second levels, respectively. When supplied with the first control signal, the switching circuit 22 (FIG. 1) of a predictive encoder according to a preferred aspect of the first embodiment of this invention switches one of the first and second prediction signals that is selected at the above-mentioned each instant to the other of the prediction signals. When supplied with the second control signal, the switching circuit 22 leaves one of the first and second prediction signals untouched from the above-specified each instant to the next succeeding instant. Summarizing, the switching circuit 22 switches the above-named second signal from one of the at least two prediction signals to another only when the absolute value q of the prediction error signal amplitude exceeds the threshold level K at a next preceding instant. It is thus possible to automatically select one of the at least two prediction signals that is most likely predictive of the value the analog or digital television signal takes at the next succeeding instant with a smaller error of prediction.

In the illustrated example of the control signal producing circuit 21, the result signal is given logic "1" and "0" values as the first and second levels, respectively. The arrangement 32 comprises a two-input Exclusive OR gate 33 responsive to a first and a second input signal, described later, for producing an output signal of a logic value equal to an Exclusive OR of the first and second input signals. The result signal is supplied to the Exclusive OR gate 33 as the first input signal. The output signal of the Exclusive OR gate 33 is supplied to a one-sample delay 34 for giving the output signal a delay of one sampling period of the sampling frequency $f_s$ to produce a delayed signal, which is fed back to the Exclusive OR gate 33 as the second input signal. It will readily be understood that the delayed signal has each of the logic "0" and "1" values insofar as the result signal is given the logic "0" value and that the result signal given the logic "1" value at one of the successive instants switches the delayed signal between the logic "0" and "1" values at an instant next succeeding the last-mentioned one instant. The first and second control signals described above are therefore provided by the delayed signal switched between the logic "1" and "0" values and that kept in whichever of the logic "1" and "0" values, respectively. It will also readily be appreciated that a control signal producing circuit 21 comprising the exemplified arrangement 32 is preferred for use in making the switching circuit 22 produce one and the other of only two prediction signals in response to the logic "1" and "0" delayed signals although at least one of the only two prediction signals may be a composite prediction signal.

Turning further to FIG. 3 wherein the abscissa is representative of time t, let it be presumed that a signal shown along line (I) is a prediction error signal obtained by the use of an interframe prediction signal alone and that another signal depicted along line (II) is a prediction error signal derived by the use of an intraframe prediction signal alone. The absolute values of the respective prediction error signals are designated by $q_A$ and $q_B$ using the suffixes representative of the switch input terminals A and B (FIG. 1). With the threshold level K set as illustrated by broken lines, the control signal producing circuit 21 comprising the above-exemplified arrangement 32 produces the delayed signal that takes the logic "0" and "1" values as shown along line (III). The still unquantized prediction error signal is therefore given the amplitudes of absolute values q exemplified along line (IV). It is possible to render the average of the absolute values q of the unquantized prediction error signal amplitude with respect to time t smaller than the averages of the absolute values $q_A$ and $q_B$ of the prediction error signals derived by the use of the interframe or intraframe prediction alone.

Referring more particularly to FIG. 3, the absolute values $q_A$ of the prediction error signal derived by only the interframe prediction exceed the threshold level K at an instant 35 for the first time as exemplified along the line (I). The delayed signal shown along the line (III) is therefore given the logic "0" value up to the instant 35 and switched to the logic "1" value at a next succeeding instant 36. The absolute values q of the unquantized prediction error signal depicted along the line (IV) are equal to the absolute values $q_A$ up to the first-mentioned instant 35 and become equal to the absolute value $q_B$ illustrated along the line (II) at the next succeeding instant 36, at which instant the absolute value $q_B$ is also above the threshold level K. The delayed signal is now switched back to the logic "0" value at an instant 37 next succeeding the instant 36 to switch, in turn, the absolute value q of the unquantized prediction error signal to the absolute value $q_A$ at the latter next succeeding instant 37, at which the last-mentioned absolute value $q_A$ is still greater than the threshold level K. The delayed signal is therefore given the logic "1" value at a next subsequent instant 38 to render the absolute value q of the unquantized prediction error signal equal to the absolute value $q_B$ of this next subsequent instant 38. Now that the absolute values $q_B$ are not greater than the threshold level K until the absolute value $q_B$ grows greater than the threshold level K at an instant next preceding another instant 39, the delayed signal is given the logic "1" value up to this next preceding instant. The absolute values q of the unquantized prediction error signal are rendered equal to the absolute values $q_B$ up to this preceding instant. At the other instant 39, the delayed signal is given the logic "0" value to switch the absolute values q of the unqauntized prediction error signal to the absolute values $q_A$ until the absolute value $q_A$ rises above the threshold level K at still another instant 40. Incidentally, it may be mentioned here that the threshold level K is selected in FIG. 1 for the quantized prediction error signal and that the threshold level K is shifted in FIG. 3 so as to correspond to the unquantized prediction error signal.

Referring now to FIG. 4, a system according to a second embodiment of this invention is for carrying out predictive decoding of a prediction error signal, such as that exemplified in FIG. 3 along the line (IV), into an analog reproduction of a television signal from which the prediction error signal is derived by a predictive encoder according to the first embodiment of this invention. Inasmuch as the predictive encoder illustrated with reference to FIG. 1 produces a variable length code signal, the predictive decoder has a decoder input terminal 41 for the variable length code signal and a decoder output terminal 42 for the analog reproduction. The variable length code signal supplied to the input terminal 41 is converted back to an equal length code signal by a code converter 44 for inversed operation of the code conversion carried out by the converter 14 of the counterpart predictive encoder. Now that the inversed code conversion has no direct connection with the gist of this invention, details thereof will be again omitted. The analog reproduction is derived from a digital reproduction of the television signal by a digital-to-analog converter 45 supplied with a sampling pulse sequence of the above-mentioned sampling frequency $f_s$. As described in conjunction with the predictive encoder, the analog and digital reproduction take, at the respective sampling instants, values of the type described hereinabove. The equal length code signal is an equivalent of the quantized prediction error signal and is again called the prediction error signal, which has amplitudes of the type described also hereinabove.

Further referring to FIG. 4, a plurality of prediction signal producing circuits, such as 46 and 47, produce at least two prediction signals in response to a input signal which is again named a first signal and will become clear as the description proceeds. These decoder prediction signal producing circuits are equivalents of the prediction signal producing circuits, such as 16 and 17, of the counterpart predictive encoder. A first of the decoder prediction signal producing circuits 46 therefore produces under the circumstances surmised hereinabove a first prediction signal predictive, at the respective ones of the sampling instants, of the values the analog or digital reproduction or the television signal takes a sampling period after the respective instants. A second of the prediction signal producing circuits 47 produces a second prediction signal, which is a one-frame-period prediction signal. Responsive to the prediction error signal and a preselected threshold level K' corresponding to the threshold level K used in the counterpart predictive encoder, a control signal producing circuit 51 produces a control signal in compliance with the law used in the counterpart circuit 21. Supplied with the control signal, a switching circuit 52 produces an output signal that corresponds to the second signal produced in the counterpart encoder and may be again called a second signal. An adder circuit 53 produces a sum signal of the last-mentioned second signal and the prediction error signal. The sum signal, which is now a decoded signal or the digital reproduction, is supplied to all prediction signal producing circuits, such as 46 and 47, as the first signal. Corresponding to the input circuit 25, an output circuit 55 comprising the digital-to-analog converter 45 produces the analog reproduction in response to the sum signal. The switching circuit 52 is biassed as symbolized by a switch arm 57 to produce the longer-period prediction signal as the second signal at the beginning of application to the decoder input terminal 41 of the prediction error signal.

While a few preferred embodiments of the present invention have thus far been described, it is possible to use three or more prediction signal producing circuits, such as 16 and 17 or 46 and 47, as has already been implicitly described. In this event, the second signal is produced with preference given to the switching among the three or more prediction signal producing circuits. Provided that the prediction signal producing circuits used in a predictive encoder according to this invention and the law used therein for switching the prediction signal producing circuits correspond to those used in a predictive decoder, it is unnecessary according to this invention to transmit from the encoder to the decoder a signal representative of the mode in which the predictive encoding is in progress at the encoder.

What is claimed is:

1. A system for carrying out prescribed one of predictive encoding of an autocorrelated signal into a prediction error signal and predictive decoding of said prediction error signal into a reproduction of said autocorrelated signal, said autocorrelated signal taking those values at equally spaced successive instants which are substantially correlated to the values said autocorrelated signal takes each of at least two predetermined durations after said instants, a first of said predetermined durations being equal at least to the equal spacing between two adjacent ones of said instants, a second of said predetermined durations being longer than said first predetermined duration, said prediction error signal having an amplitude variable from one of said instants to another thereof in complicance with said autocorrelated signal, said system comprising:

a plurality of prediction signal producing means responsive to a first signal for producing at least two prediction signals, a first and a second of said prediction signals being predictive, at the respective ones of said instants, of the values said autocorrelated signal takes said first and second predetermined durations, respectively, after said respective instants;

control signal producing means responsive to said prediction error signal for producing a control signal depending on the amplitude said prediction error signal has at each of said instants;

switching means responsive to said control signal for selecting one of said at least two prediction signals to produce a second signal at an instant next succeeding said each instant;

adder means for producing a sum signal of said second signal and said prediction error signal;

means for supplying said sum signal to all of said prediction signal producing means as said first signal; and input means responsive to said autocorrelated signal and said second signal for producing said prediction error signal when said system is for carrying out the predictive encoding and output means responsive to said sum signal for producing said reproduction when said system is for carrying out the predictive decoding.

2. A system as claimed in claim 1 for carrying out the predictive encoding, wherein said input means comprises subtractor means for producing as said prediction error signal a difference signal between said second signal and said autocorrelated signal, said adder means producing as said sum signal a locally decoded signal of a value representative of the value said autocorrelated signal takes at said each instant.

3. A system as claimed in claim 1 for carrying out the predictive decoding, wherein said adder means comprises an adder responsive to an input signal and said second signal for producing an output signal representative of a sum of said input and second signals, and means for supplying said prediction error signal to said adder as said input signal, said output signal providing said reproduction.

4. A system as claimed in claim 1, wherein said switching means comprises means for selecting said second prediction signal when said autocorrelated signal starts for said system carrying out the predictive encoding and when said prediction error signal starts for said system carrying out the predictive decoding.

5. A system as claimed in claim 4, wherein said control signal producing means comprises means for comparing said prediction error signal a preselected threshold level to produce a result signal that has a first and a second level when the amplitude said prediction error signal has at said each instant is greater and not greater in absolute value than said threshold level, respectively, and means responsive to said result signal for producing as said control signal a first and a second control signal at said next succeeding instant when said result signal has said first and second levels, respectively, said switching means further comprising means responsive to said first and second control signals for switching one of said at least two prediction signals that is selected at said each instant to the other thereof to produce said other prediction signal as said second signal and for keeping one of said at least two prediction signals from said each instant to said next succeeding instant to produce said one prediction signal as said second signal, respectively.

6. A system as claimed in claim 5, said first and second levels being one and the other of logic "1" and "0" values, wherein said first and second control signal producing means comprises a two-input Exclusive OR gate responsive to a first and a second input signal for producing an output signal of a value equal to an Exclusive OR of said first and second input signals, means for supplying said result signal to said Exclusive OR gate as said first input signal, means for giving said output signal of said Exclusive OR gate a delay equal to said equal spacing to produce a delayed signal, and means for supplying said delayed signal to said Exclusive OR gate as said second input signal, the delayed signal switched between said one and the other of said logic "1" and "0" values serving as said first control signal, the delayed signals kept at said one and the other of said logic "1" and "0" values, respectively, serving as said second control signal.

* * * * *